(12) United States Patent
Harris et al.

(10) Patent No.: US 8,937,373 B2
(45) Date of Patent: Jan. 20, 2015

(54) HIGHLY LUMINESCENT II-V SEMICONDUCTOR NANOCRYSTALS

(75) Inventors: Daniel K. Harris, Cambridge, MA (US); Moungi G. Bawendi, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 13/348,126

(22) Filed: Jan. 11, 2012

(65) Prior Publication Data

US 2013/0178047 A1 Jul. 11, 2013

(51) Int. Cl.
*H01L 23/495* (2006.01)

(52) U.S. Cl.
USPC ............ 257/666; 438/478; 257/E21.09

(58) Field of Classification Search
USPC ........................... 257/666; 438/478
See application file for complete search history.

(56) References Cited

U.S. PATENT DOCUMENTS

| | | | |
|---|---|---|---|
| 6,576,291 B2* | 6/2003 | Bawendi et al. | 427/215 |
| 7,390,568 B2* | 6/2008 | Kim et al. | 428/403 |
| 7,394,091 B2* | 7/2008 | Isobe et al. | 257/10 |
| 7,407,527 B2* | 8/2008 | Hyeon | 75/351 |
| 7,642,557 B2* | 1/2010 | Klimov et al. | 257/79 |
| 7,803,423 B2* | 9/2010 | O'Brien et al. | 427/213.34 |
| 7,825,405 B2* | 11/2010 | Kim et al. | 257/40 |
| 7,867,556 B2* | 1/2011 | Pickett | 427/214 |
| 7,867,557 B2* | 1/2011 | Pickett et al. | 427/214 |
| 7,985,446 B2* | 7/2011 | O'Brien et al. | 427/214 |
| 8,062,703 B2* | 11/2011 | O'Brien et al. | 427/213.31 |
| 8,524,365 B2* | 9/2013 | O'Brien et al. | 428/403 |
| 2003/0129311 A1* | 7/2003 | Huang | 427/337 |
| 2006/0234417 A1* | 10/2006 | Isobe et al. | 438/99 |
| 2008/0220593 A1* | 9/2008 | Pickett et al. | 438/478 |
| 2011/0108799 A1* | 5/2011 | Pickett | 257/14 |
| 2011/0281070 A1* | 11/2011 | Mittal et al. | 428/142 |
| 2012/0025155 A1* | 2/2012 | O'Brien et al. | 252/519.4 |

OTHER PUBLICATIONS

Dannhauser et al., "Photophysics of Quantized Colloidal Semiconductors Dramatic Luminescence Enhancement by Binding of Simple Amines", J. Phys. Chem., 1986, 90, pp. 6074-6076.*
Wei et al., "Isostructural Cd3E2 (E = P, As) Microcrystals Prepared via a Hydrothermal Route", Crystal Growth & Design, vol. 6, No. 4, 2006, pp. 849-853.*
O'Neil et al., "Dynamics of Electron-Hole Pair Recombination in Semiconductor Clusters", J. Phys. Chem., 1990, 94, pp. 4356-4363.*
Fojtik, A., et al., "Photochemistry of Semiconductor Colloids, Size Quantization Effects in Q-Cadmium Arsenide," Chemical Physics Letters, vol. 120, No. 6, Oct. 25, 1985, pp. 552-554.

(Continued)

*Primary Examiner* — Caleb Henry
(74) *Attorney, Agent, or Firm* — Steptoe & Johnson LLP (57) ABSTRACT

A population of semiconductor nanocrystals can include cores including a II-V semiconductor material, e.g., $Cd_3As_2$. The population can be monodisperse and can have a quantum yield of 20% or greater. A size-series of populations can have emission wavelengths falling in the range of about 530 nm to about 2000 nm.

23 Claims, 8 Drawing Sheets

(56) References Cited

OTHER PUBLICATIONS

Green, M., et al., "The synthesis of cadmium phosphide nanoparticles using cadmium diorganophosphide precursors," J. Mater. Chem., 1999, 9, pp. 243-247.

Miao, S., et al., "Synthesis and Characterization of Cadmium Phosphide Quantum Dots Emitting in the Visible Red to Near-Infrared," J. Am. Chem., Soc. 2010, 132, pp. 5613-5615; Supporting Information, pp. 1-11.

Shen, G., et al., "Synthesis and Structures of High-Quality Single-Crystalline $II_3$-$V_2$ Semiconductors Nanobelts," J. Phys. Chem., C 2007, 111, pp. 5044-5049.

Wang, R., et al., "Magic-Sized $Cd_3P_2$ II-V Nanoparticles Exhibiting Bandgap Photoemission," J. Phys. Chem., 2009, 113, pp. 17979-17982; Figs. S1-S6, pp. 1-10.

Xie, Renguo, et al., "Synthesis of Monodisperse, Highly Emissive, and Size-Tunable $Cd_3P_2$ Nanoparticles," Chem. Mater., 2010, 22, pp. 3820-3822; Supporting Information, pp. 1-4.

\* cited by examiner

HIGHLY LUMINESCENT II-V SEMICONDUCTOR NANOCRYSTALS

FEDERALLY SPONSORED RESEARCH OR DEVELOPMENT

This invention was made with government support under Grant No. W911NF-07-D-0004 awarded by the Army Research Office. The government has certain rights in this invention.

TECHNICAL FIELD

This invention relates to highly luminescent II-V semiconductor nanocrystals and methods of making and using them.

BACKGROUND

Semiconductor nanocrystals are a powerful class of nanostructures that can exhibit high photoluminescence quantum yields, large molar extinction coefficients, high photostability compared to typical molecular fluorophores, and size-tunable emission wavelengths that can extend across the visible and near-IR spectral range. These properties make semiconductor nanocrystals useful in applications including biological fluorescent tags and light-emitting devices, among others.

Nanocrystals having small dimensions can have properties intermediate between molecular and bulk forms of matter. For example, nanocrystals of semiconductor materials having sufficiently small dimensions can exhibit quantum confinement of excitons (excited state electron-hole pair) in all three dimensions. Quantum confinement leads to an increase in the effective band gap of the material with decreasing crystallite size. Consequently, both the optical absorption and emission of nanocrystals shift to the blue (i.e., to higher energies) as the size of the nanocrystal decreases.

The quantum efficiency of emission from nanocrystals having a core of a first semiconductor material can be enhanced by applying an overcoating of a second semiconductor material such that the conduction band of the second semiconductor material is of higher energy than that of the first semiconductor material, and the valence band of the second semiconductor material is of lower energy than that of the first semiconductor material. As a result, both charge carriers of an exciton, i.e., electrons and holes, are confined in the core of the nanocrystal.

SUMMARY

Semiconductor nanocrystals have size-dependent optical and electronic properties. In particular, the band gap energy of a semiconductor nanocrystal of a particular semiconductor material varies with the diameter of the crystal. Generally, a semiconductor nanocrystal is a member of a population of nanocrystals having a distribution of sizes. When the distribution is centered about a single value and narrow, the population can be described as monodisperse. Monodisperse particles can be defined as having at least 60% of the particles fall within a specified particle size range. Monodisperse particles can have 10% or less rms deviation in diameter, preferably 5% or less.

Many applications of semiconductor nanocrystals depend on their photoluminescent properties. Accordingly, semiconductor nanocrystals having narrow emission linewidths (expressed, for example, as a full width at half max), known emission energies, and high quantum yields are desirable.

In one aspect, a population of semiconductor nanocrystals includes a plurality of cores including $Cd_3As_2$, wherein the population is a monodisperse population. The cores can have 10% or less, or 5% or less, rms deviation in diameter. The population can have a photoluminescence quantum yield of at least 20%, at least 30%, at least 40%, at least 50%, at least 60%, at least 70%, or at least 80%. The plurality of cores can have an average diameter falling within the range of about 2 nm to about 5 nm.

The semiconductor nanocrystals can further include an overcoating including a semiconductor material on the cores. The overcoating can include a II-V semiconductor material, a II-VI semiconductor material, a III-V semiconductor material, or a combination thereof. The overcoating can include a II-V semiconductor material having a bulk band gap larger than the bulk band gap of $Cd_3As_2$. The II-V semiconductor material of the overcoating can include $Cd_3P_2$.

In another aspect, a size-series of populations of semiconductor nanocrystals includes a plurality of populations of semiconductor nanocrystals including cores including $Cd_3As_2$, wherein the cores of each population have a different average diameter than the cores of the other populations.

Each population of the series can be a monodisperse population. The cores can have 10% or less, or 5% or less, rms deviation in diameter. The population can have a photoluminescence quantum yield of at least 20%, at least 30%, at least 40%, at least 50%, at least 60%, at least 70%, or at least 80%. At least one population can have a visible emission wavelength. At least one population can have an infrared emission wavelength. The populations can have emission wavelengths falling within the range of about 530 nm to about 2000 nm; about 600 nm to about 1900 nm; about 700 nm to about 1800 nm; about 800 nm to about 1700 nm; about 900 nm to about 1600 nm; or about 1200 nm to about 2000 nm.

The series can include at least five populations having emission wavelengths spanning the range of about 600 nm to about 1800 nm. The cores of each population can have an average diameter falling within the range of about 2 nm to about 5 nm.

In another aspect, a method of making semiconductor nanocrystals includes introducing into a coordinating solvent an cadmium-containing compound and an arsenic donor, thereby forming a plurality of cores including $Cd_3As_2$, wherein the population is a monodisperse population.

Introducing can include heating a composition including the coordinating solvent and the cadmium-containing compound, rapidly adding a first portion of the arsenic donor to the composition, and slowly adding a second portion of the arsenic donor. Slowly adding the second portion can include a substantially continuous slow addition of the second portion.

The method can further include stopping the reaction when the population of semiconductor nanocrystals has a desired size, desired peak absorption wavelength, or desired peak emission wavelength. The method can reproducibly form populations of semiconductor nanocrystals having the same desired peak emission wavelength ±10 nm. The method can reproducibly form populations of semiconductor nanocrystals having a narrow FWHM.

The plurality of cores can have an average diameter falling within the range of about 2 nm to about 5 nm. The method can further include forming an overcoating including a semiconductor material on the cores.

Other aspects, embodiments, and features will be apparent from the following description, the drawings, and the claims.

BRIEF DESCRIPTION OF THE DRAWINGS

FIG. 3b shows 4.5 nm $Cd_3As_2$ nanocrystals with emission peak at 0.76 eV. Scale bar is 20 nm for both FIGS. 3a and 3b.

FIGS. 5a-5c show a $^1$H NMR spectra of: FIG. 5a, tris(trimethylsilyl)arsine ($TMS_3As$) in toluene-$d_8$ at 20° C.; FIG. 5b, reaction mixture of $TMS_3As$ with excess cadmium (II) myristate ($Cd(MA)_2$) in toluene-$d_8$, mixed at 100° C. and cooled immediately; FIG. 5c, reaction mixture of $TMS_3As$ with excess $Cd(MA)_2$ mixed at 100° C. and heated for 5 minutes before cooling.

FIG. 8a shows QY measurements showing enhanced stability of $Cd_3As_2(Cd_3P_2)$ core(shell) nanocrystals relative to cores. FIG. 8b shows emission spectra showing redshift upon addition of $TMS_3P$; FIG. 8c shows emission spectra showing blueshift upon aging in air. Nanocrystal samples were stored in NMR tubes under identical ambient conditions during this experiment.

DETAILED DESCRIPTION

Semiconductor nanocrystals demonstrate quantum confinement effects in their luminescent properties. When semiconductor nanocrystals are illuminated with a primary energy source, a secondary emission of energy occurs at a frequency that relates to the band gap of the semiconductor material used in the nanocrystal. In quantum confined particles, the frequency is also related to the size of the nanocrystal.

Colloidal semiconductor nanocrystals luminescent in the infrared (IR) are an important materials class due to their ability to emit at the telecommunications wavelengths of 1.3 µm and 1.5 µm and in the second in-vivo imaging window between 1.1 µm and 1.35 µm. See, e.g., Lim, Y. T.; et al., *Mol. Imaging.* 2003, 2, (1), 50-64, which is incorporated by reference in its entirety. Previous work on IR-emitting semiconductor nanocrystals has been primarily focused on indium arsenide and the lead chalcogenides. See, for example, Allen, P. M.; et al., J Am Chem Soc 2010, 132, (2), 470; Allen, P. M.; et al., J Am Chem Soc 2008, 130, (29), 9240; Kim, S. W.; et al., J Am Chem Soc 2005, 127, (30), 10526-10532; Battaglia, D.; Peng, X., Nano Lett 2002, 2, (9), 1027-1030; Cao, Y. W.; Banin, U., J Am Chem Soc 2000, 122, (40), 9692-9702; Guzelian, A. A.; et al., Appl Phys Lett 1996, 69, (10), 1432-1434; Hines, M.; Scholes, G., Adv Mater (Weinheim, Ger) 2003, 15, (21), 1844-1849; Yu, W. W.; et al., Chem Mater 2004, 16, (17), 3318-3322; Semonin, O. E.; et al., J. Phys. Chem. Lett. 2010, 1, (16), 2445-2450; Stouwdam, J. W.; et al., J Phys Chem C 2006, 111, (3), 1086-1092; and Pietryga, J. M.; et al., J Am Chem Soc 2008, 130, (14), 4879-4885, each of which is incorporated by reference in its entirety.

A size-series of IR-emitting semiconductor nanocrystals, e.g., nearly monodisperse cadmium arsenide, showing well defined absorption features and bright emission, expands the available nanocrystal IR materials. See, for example, Harris, D. K.; et al., J Am Chem Soc 2011, 133, 4676-4679, which is incorporated by reference in its entirety.

Bulk $Cd_3As_2$ is a II-V semiconductor with a narrow band gap. Although there is some debate in the literature regarding the band structure of this material, most experimental results and theoretical predictions suggest an inverted band structure with a band gap of −0.19 eV. See, e.g., Omani, M.; et al., Nanotechnology 2008, 19, (10), 105301; Dowgiallo-Plenkiewicz, B.; et al., Phys Status Solidi B 1979, 94, (1), K57-K60; and Aubin, M. J.; et al., Phys Rev B 1977, 15, (8), 3872; each of which is incorporated by reference in its entirety. Bulk $Cd_3As_2$ has high carrier concentrations ($2 \cdot 10^{18}$ cm$^{-3}$) and electron mobilities (10,000 cm$^2$/V-s). In addition, the electron and hole effective masses are $m_e^*$=0.016 $m_o$ and $m_h^*$=0.12 $m_o$, giving an estimated exciton Bohr radius of ~47 nm. Thus, this material is expected to show extreme quantum confinement similar to that observed in PbSe (exciton Bohr radius ~45 nm) (see Wise, F. W., Acc Chem Res 2000, 33, (11), 773-780, which is incorporated by reference in its entirety). The narrow band gap combined with the large exciton Bohr radius can provide semiconductor nanocrystals that show band edge emission over a wide spectral range from 0.65 eV to 2.5 eV (~530-2000 nm).

Nanocrystals made from materials with inverted bulk band structure present theoretical challenges, because the bands are strongly mixed away from the zone center. The use of a tight binding model to describe the evolution of states in quantum confined negative gap semiconductors has predicted novel properties such as intrinsic surface gap-states and an excitonic insulator phase (Malkova, N.; Bryant, G. W., Phys Rev B 2010, 82, (15), 155314, which is incorporated by reference in its entirety). Thus, the synthesis of high quality cadmium arsenide nanocrystals can facilitate the experimental study of the optical properties of nanocrystals made from a material with an inverted band structure. Much like bulk III-V and II-VI semiconductors, II-V semiconductors are isomorphic and readily form solid solutions (Arushanov, E. K., Prog Cryst Growth Charact Mater 1992, 25, (3), 131-201, which is incorporated by reference in its entirety), which can facilitate the development of II-V QD hetero structures and alloys.

In general, the method of manufacturing a nanocrystal is a colloidal growth process. See, for example, U.S. Pat. Nos. 6,322,901 and 6,576,291, and U.S. patent application Ser. No. 12/862,195, filed Aug. 24, 2010, each of which is incorporated by reference in its entirety. Colloidal growth can result when an M-containing compound and an X donor are rapidly injected into a hot coordinating solvent. The coordinating solvent can include an amine. The M-containing compound can be a metal, an M-containing salt, or an M-containing organometallic compound. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. In some circumstances, the growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M-containing compound or X donor, the growth period can be shortened. When adding more M-containing compound or X donor after the initial injection, the addition can be relatively slow, e.g., in several discrete portions added at intervals, or a slow continuous addition.

In some cases, M belongs to group II and X belongs to group V, such that the resulting semiconductor nanocrystal includes a II-V semiconductor material. For example, the M-containing compound can be a cadmium-containing compound and the X donor can be an arsenic donor, such that the resulting semiconductor nanocrystal includes a cadmium arsenide semiconductor material, e.g., $Cd_3As_2$.

The M-containing salt can be a non-organometallic compound, e.g., a compound free of metal-carbon bonds. M can be cadmium, zinc, magnesium, mercury, aluminum, gallium, indium, thallium, or lead. The M-containing salt can be a metal halide, metal carboxylate, metal carbonate, metal hydroxide, metal oxide, or metal diketonate, such as a metal acetylacetonate. The M-containing salt is less expensive and safer to use than organometallic compounds, such as metal alkyls. For example, the M-containing salts are stable in air, whereas metal alkyls are generally unstable in air. M-containing salts such as 2,4-pentanedionate (i.e., acetylacetonate (acac)), halide, carboxylate, hydroxide, oxide, or carbonate salts are stable in air and allow nanocrystals to be manufactured under less rigorous conditions than corresponding metal alkyls. In some cases, the M-containing salt can be a long-chain carboxylate salt, e.g., a $C_8$ or higher (such as $C_8$ to $C_{20}$, or $C_{12}$ to $C_{18}$), straight chain or branched, saturated or unsaturated carboxylate salt. Such salts include, for example, M-containing salts of lauric acid, myristic acid, palmitic acid, stearic acid, arachidic acid, palmitoleic acid, oleic acid, linoleic acid, linolenic acid, or arachidonic acid.

Suitable M-containing salts include cadmium acetylacetonate, cadmium iodide, cadmium bromide, cadmium chloride, cadmium hydroxide, cadmium carbonate, cadmium acetate, cadmium myristate, cadmium oleate, cadmium oxide, zinc acetylacetonate, zinc iodide, zinc bromide, zinc chloride, zinc hydroxide, zinc carbonate, zinc acetate, zinc myristate, zinc oleate, zinc oxide, magnesium acetylacetonate, magnesium iodide, magnesium bromide, magnesium chloride, magnesium hydroxide, magnesium carbonate, magnesium acetate, magnesium myristate, magnesium oleate, magnesium oxide, mercury acetylacetonate, mercury iodide, mercury bromide, mercury chloride, mercury hydroxide, mercury carbonate, mercury acetate, mercury myristate, mercury oleate, aluminum acetylacetonate, aluminum iodide, aluminum bromide, aluminum chloride, aluminum hydroxide, aluminum carbonate, aluminum acetate, aluminum myristate, aluminum oleate, gallium acetylacetonate, gallium iodide, gallium bromide, gallium chloride, gallium hydroxide, gallium carbonate, gallium acetate, gallium myristate, gallium oleate, indium acetylacetonate, indium iodide, indium bromide, indium chloride, indium hydroxide, indium carbonate, indium acetate, indium myristate, indium oleate, thallium acetylacetonate, thallium iodide, thallium bromide, thallium chloride, thallium hydroxide, thallium carbonate, thallium acetate, thallium myristate, or thallium oleate.

Prior to combining the M-containing salt with the X donor, the M-containing salt can be contacted with a coordinating solvent to form an M-containing precursor. Typical coordinating solvents include alkyl phosphines, alkyl phosphine oxides, alkyl phosphonic acids, or alkyl phosphinic acids; however, other coordinating solvents, such as pyridines, furans, and amines may also be suitable for the nanocrystal production. Examples of suitable coordinating solvents include pyridine, tri-n-octyl phosphine (TOP) and tri-n-octyl phosphine oxide (TOPO). Technical grade TOPO can be used. The coordinating solvent can include a 1,2-diol or an aldehyde. The 1,2-diol or aldehyde can facilitate reaction between the M-containing salt and the X donor and improve the growth process and the quality of the nanocrystal obtained in the process. The 1,2-diol or aldehyde can be a $C_6$-$C_{20}$ 1,2-diol or a $C_6$-$C_{20}$ aldehyde. A suitable 1,2-diol is 1,2-hexadecanediol or myristol and a suitable aldehyde is dodecanal is myristic aldehyde.

The X donor is a compound capable of reacting with the M-containing salt to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, elemental sulfur, bis(trimethylsilyl)selenide (($TMS)_2Se$), trialkyl phosphine selenides such as (tri-n-octylphosphine)selenide (TOPSe) or (tri-n-butylphosphine)selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), sulfur, bis(trimethylsilyl)sulfide (($TMS)_2S$), a trialkyl phosphine sulfide such as (tri-n-octylphosphine) sulfide (TOPS), tris(dimethylamino) arsine, an ammonium salt such as an ammonium halide (e.g., $NH_4Cl$), tris(trimethylsilyl)phosphide (($TMS)_3P$), tris(trimethylsilyl) arsenide (($TMS)_3As$), or tris(trimethylsilyl)antimonide (($TMS)_3Sb$). In certain embodiments, the M donor and the X donor can be moieties within the same molecule.

The X donor can be a compound of formula (I):

$$X(Y(R)_3)_3 \qquad (I)$$

where X is a group V element, Y is a group IV element, and each R, independently, is alkyl, alkenyl, alkynyl, cycloalkyl, cycloalkenyl, heterocyclyl, aryl, or heteroaryl, where each R, independently, is optionally substituted by 1 to 6 substituents independently selected from hydrogen, halo, hydroxy, nitro, cyano, amino, alkyl, cycloalkyl, cycloalkenyl, alkoxy, acyl, thio, thioalkyl, alkenyl, alkynyl, cycloalkenyl, heterocyclyl, aryl, or heteroaryl. See, e.g., provisional U.S. Patent Application No. 61/535,597, filed Sep. 16, 2011, which is incorporated by reference in its entirety.

In some embodiments, X can be N, P, As, or Sb. Y can be C, Si, Ge, Sn, or Pb. Each R, independently, can be alkyl or cycloalkyl. In some cases, each R, independently, can be unsubstituted alkyl or unsubstituted cycloalkyl, for example, a $C_1$ to $C_8$ unsubstituted alkyl or a $C_3$ to $C_8$ unsubstituted cycloalkyl. In some embodiments, X can be P, As, or Sb. In some embodiments, Y can be Ge, Sn, or Pb.

In some embodiments, X can be P, As, or Sb, Y can be Ge, Sn, or Pb, and each R, independently, can be unsubstituted alkyl or unsubstituted cycloalkyl, for example, a $C_1$ to $C_8$ unsubstituted alkyl or a $C_3$ to $C_8$ unsubstituted cycloalkyl.

Each R, independently, can be unsubstituted alkyl, for example, a $C_1$ to $C_6$ unsubstituted alkyl.

Alkyl is a branched or unbranched saturated hydrocarbon group of 1 to 30 carbon atoms, such as methyl, ethyl, n-propyl, isopropyl, n-butyl, isobutyl, t-butyl, octyl, decyl, tetradecyl, hexadecyl, eicosyl, tetracosyl and the like. Optionally, an alkyl group can be substituted by 1 to 6 substituents independently selected from hydrogen, halo, hydroxy, nitro, cyano, amino, alkyl, cycloalkyl, cycloalkenyl, alkoxy, acyl, thio, thioalkyl, alkenyl, alkynyl, cycloalkenyl, heterocyclyl, aryl, or heteroaryl. Optionally, an alkyl group can contain 1 to 6 linkages selected from —O—, —S—, -M- and —NR— where R is hydrogen, or $C_1$-$C_8$ alkyl or lower alkenyl. Cycloalkyl is a cyclic saturated hydrocarbon group of 3 to 10 carbon atoms, such as cyclopropyl, cyclobutyl, cyclopentyl, cyclohexyl, cycloheptyl, cyclooctyl, and the like. A cycloalkyl group can be optionally substituted, or contain linkages, as an alkyl group does.

Alkenyl is a branched or unbranched unsaturated hydrocarbon group of 2 to 20 carbon atoms containing at least one double bond, such as vinyl, propenyl, butenyl, and the like. Cycloalkenyl is a cyclic unsaturated hydrocarbon group of 3 to 10 carbon atoms including at least one double bond. An alkenyl or cycloalkenyl group can be optionally substituted, or contain linkages, as an alkyl group does.

Alkynyl is a branched or unbranched unsaturated hydrocarbon group of 2 to 20 carbon atoms containing at least one triple bond, such as ethynyl, propynyl, butynyl, and the like. An alkynyl group can be optionally substituted, or contain linkages, as an alkyl group does.

Heterocyclyl is a 3- to 10-membered saturated or unsaturated cyclic group including at least one ring heteroatom selected from O, N, or S. A heterocylyl group can be optionally substituted, or contain linkages, as an alkyl group does.

Aryl is a 6- to 14-membered carbocyclic aromatic group which may have one or more rings which may be fused or unfused. In some cases, an aryl group can include an aromatic ring fused to a non-aromatic ring. Exemplary aryl groups include phenyl, naphthyl, or anthracenyl. Heteroaryl is a 6- to 14-membered aromatic group which may have one or more rings which may be fused or unfused. In some cases, a heteroaryl group can include an aromatic ring fused to a non-aromatic ring. An aryl or heteroaryl group can be optionally substituted, or contain linkages, as an alkyl group does.

Examples of X donors of formula (I) include: tris(trimethylsilyl)nitride, $N(Si(CH_3)_3)_3$ tris(trimethylgermyl)nitride, $N(Ge(CH_3)_3)_3$; tris(trimethylstannyl)nitride, $N(Sn(CH_3)_3)_3$; tris(trimethylplumbyl)nitride, $N(Pb(CH_3)_3)_3$; tris(trimethylsilyl)phosphide, $P(Si(CH_3)_3)_3$; tris(trimethylgermyl)phosphide, $P(Ge(CH_3)_3)_3$; tris(trimethylstannyl)phosphide, $P(Sn(CH_3)_3)_3$; tris(trimethylplumbyl)phosphide, $P(Pb(CH_3)_3)_3$; tris(trimethylsilyl)arsine, $As(Si(CH_3)_3)_3$; tris(trimethylgermyl)arsine, $As(Ge(CH_3)_3)_3$; tris(trimethylstannyl)arsine, $As(Sn(CH_3)_3)_3$; tris(trimethylplumbyl)arsine, $As(Pb(CH_3)_3)_3$; tris(trimethylsilyl)stibine, $Sb(Si(CH_3)_3)_3$; tris(trimethylgermyl)stibine, $Sb(Ge(CH_3)_3)_3$; tris(trimethylstannyl)stibine, $Sb(Sn(CH_3)_3)_3$; and tris(trimethylplumbyl)stibine, $Sb(Pb(CH_3)_3)_3$.

For given values of X and R, varying Y can produce X donors having varying reactivity, e.g., different reaction kinetics in the formation of semiconductor nanocrystals. Thus, the reactivity of tris(trimethylsilyl)arsine in the formation of nanocrystals can be different from the reactivity of tris(trimethylstannyl)arsine or tris(trimethylplumbyl)arsine in an otherwise similar reaction. Likewise, for given values of X and Y, variations in R can produce variations in reactivity. In the formation of nanocrystals, reactivity (and particularly reaction kinetics) can affect the size and size distribution of the resulting population of nanocrystals. Thus, selection of precursors having appropriate reactivity can aid in forming a population of nanocrystals having desirable properties, such as a particular desired size and/or a narrow size distribution.

The nanocrystal manufactured from an M-containing salt can grow in a controlled manner when the coordinating solvent includes an amine. The amine in the coordinating solvent can contribute to the quality of the nanocrystal obtained from the M-containing salt and X donor. The coordinating solvent can a mixture of the amine and an alkyl phosphine oxide. The combined solvent can decrease size dispersion and can improve photoluminescence quantum yield of the nanocrystal. The amine can be a primary alkyl amine or a primary alkenyl amine, such as a $C_2$-$C_{20}$ alkyl amine, a $C_2$-$C_{20}$ alkenyl amine, preferably a $C_8$-$C_{18}$ alkyl amine or a $C_8$-$C_{18}$ alkenyl amine. For example, suitable amines for combining with trioctylphosphine oxide (TOPO) include 1-hexadecylamine, or oleylamine. When the 1,2-diol or aldehyde and the amine are used in combination with the M-containing salt to form a population of nanocrystals, the photoluminescence quantum efficiency and the distribution of nanocrystal sizes are improved in comparison to nanocrystals manufactured without the 1,2-diol or aldehyde or the amine.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX (e.g., for a II-VI semiconductor material) or $M_3X_2$ (e.g., for a II-V semiconductor material), where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, both CdSe and CdS can be tuned in the visible region and InAs can be tuned in the infrared region. $Cd_3As_2$ can be tuned from the visible through the infrared.

A population of nanocrystals can have a narrow size distribution. The population can be monodisperse and can exhibit less than a 15% rms deviation in diameter of the nanocrystals, preferably less than 10%, more preferably less than 5%. Spectral emissions in a narrow range of between 10 and 100 nm full width at half max (FWHM) can be observed. Semiconductor nanocrystals can have emission quantum efficiencies (i.e., quantum yields, QY) of greater than 2%, 5%, 10%, 20%, 40%, 60%, 70%, 80%, or 90%. In some cases, semiconductor nanocrystals can have a QY of at least 90%, at least 91%, at least 92%, at least 93%, at least 94%, at least 95%, at least 96%, at least 97%, at least 97%, at least 98%, or at least 99%.

The semiconductor forming the core of the nanocrystal can include Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdSe, CdTe, $Cd_3P_2$, $Cd_3As_2$, HgS, HgSe, HgTe, AN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

The quantum efficiency of emission from nanocrystals having a core of a first semiconductor material can be enhanced by applying an overcoating of a second semiconductor material such that the conduction band of the second semiconductor material is of higher energy than that of the first semiconductor material, and the valence band of the second semiconductor material is of lower energy than that of the first semiconductor material. As a result, charge carriers, i.e., electrons and holes, are confined in the core of the nanocrystal when in an excited state. Alternatively, the conduction band or valence band of overcoating material can have an energy intermediate between the energies of the conduction and valence bands of the core material. In this case, one carrier can be confined to the core while the other is confined to the overcoating material when in an excited state. See, for example, U.S. Pat. No. 7,390,568, which is incorporated by reference in its entirety. The core can have an overcoating on a surface of the core. The band gap of core and overcoating can have a desired band offset.

In CdTe/CdSe (core/shell) nanocrystals, the conduction band of the shell is intermediate in energy to the valence band and conduction band of the core. CdTe/CdSe (core/shell) nanocrystals have lower potentials for the holes in the core and for the electrons in the shell. As a result, the holes can be mostly confined to the CdTe core, while the electrons can be mostly confined to the CdSe shell. CdSe/ZnTe (core/shell) nanocrystals have the valence band of the shell intermediate in energy to the valence band and conduction band of the core. As a result, the electrons reside mostly in the CdSe cores, while the holes reside mostly in the ZnTe shells. The overcoating can be a semiconductor material having a composition different from the composition of the core, and can have a band gap greater than the band gap of the core. The overcoat of a semiconductor material on a surface of the nanocrystal can include a Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdSe, CdTe, $Cd_3P_2$, $Cd_3As_2$, HgS, HgSe, HgTe, AN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof.

Shells are formed on nanocrystals by introducing shell precursors at a temperature where material adds to the surface of existing nanocrystals but at which nucleation of new particles is rejected. In order to help suppress nucleation and anisotropic elaboration of the nanocrystals, selective ionic layer adhesion and reaction (SILAR) growth techniques can be applied. See, e.g., U.S. Pat. No. 7,767,260, which is incorporated by reference in its entirety. In the SILAR approach, metal and chalcogenide precursors are added separately, in an alternating fashion, in doses calculated to saturate the available binding sites on the nanocrystal surfaces, thus adding one-half monolayer with each dose. The goals of such an approach are to: (1) saturate available surface binding sites in each half-cycle in order to enforce isotropic shell growth; and (2) avoid the simultaneous presence of both precursors in solution so as to minimize the rate of homogenous nucleation of new nanoparticles of the shell material.

In the SILAR approach, it can be beneficial to select reagents that react cleanly and to completion at each step. In other words, the reagents selected should produce few or no reaction by-products, and substantially all of the reagent added should react to add shell material to the nanocrystals. Completion of the reaction can be favored by adding sub-stoichiometric amounts of the reagent. In other words, when less than one equivalent of the reagent is added, the likelihood of any unreacted starting material remaining is decreased.

The quality of core-shell nanocrystals produced (e.g., in terms of size monodispersity and QY) can be enhanced by using a constant and lower shell growth temperature. Alternatively, high temperatures may also be used. In addition, a low-temperature or room temperature "hold" step can be used during the synthesis or purification of core materials prior to shell growth.

The outer surface of the nanocrystal can include a layer of compounds derived from the coordinating agent used during the growth process. The surface can be modified by repeated exposure to an excess of a competing coordinating group to form an overlayer. For example, a dispersion of the capped nanocrystal can be treated with a coordinating organic compound, such as pyridine, to produce crystals which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal.

Monodentate alkyl phosphines (and phosphine oxides; the term phosphine below will refer to both) can passivate nanocrystals efficiently. When nanocrystals with conventional monodentate ligands are diluted or embedded in a non-passivating environment (i.e., one where no excess ligands are present), they tend to lose their high luminescence. Typical are an abrupt decay of luminescence, aggregation, and/or phase separation. In order to overcome these limitations, polydentate ligands can be used, such as a family of polydentate oligomerized phosphine ligands. The polydentate ligands show a high affinity between ligand and nanocrystal surface. In other words, they are stronger ligands, as is expected from the chelate effect of their polydentate characteristics.

In general, a ligand for a nanocrystal can include a first monomer unit including a first moiety having affinity for a surface of the nanocrystal, a second monomer unit including a second moiety having a high water solubility, and a third monomer unit including a third moiety having a selectively reactive functional group or a selectively binding functional group. In this context, a "monomer unit" is a portion of a polymer derived from a single molecule of a monomer. For example, a monomer unit of poly(ethylene) is —$CH_2CH_2$—, and a monomer unit of poly(propylene) is —$CH_2CH(CH_3)$—. A "monomer" refers to the compound itself, prior to polymerization, e.g., ethylene is a monomer of poly(ethylene) and propylene of poly(propylene).

A selectively reactive functional group is one that can form a covalent bond with a selected reagent under selected conditions. One example of a selectively reactive functional group is a primary amine, which can react with, for example, a succinimidyl ester in water to form an amide bond. A selectively binding functional group is a functional group that can form a noncovalent complex with a selective binding counterpart. Some well-known examples of selectively binding functional groups and their counterparts include biotin and streptavidin; a nucleic acid and a sequence-complementary nucleic acid; FK506 and FKBP; or an antibody and its corresponding antigen.

A moiety having high water solubility typically includes one or more ionized, ionizable, or hydrogen bonding groups, such as, for example, an amine, an alcohol, a carboxylic acid, an amide, an alkyl ether, a thiol, or other groups known in the art. Moieties that do not have high water solubility include, for example, hydrocarbyl groups such as alkyl groups or aryl groups, haloalkyl groups, and the like. High water solubility can be achieved by using multiple instances of a slightly soluble group: for example, diethyl ether is not highly water soluble, but a poly(ethylene glycol) having multiple instances of a —CH$_2$—O—CH$_2$— alkyl ether group can be highly water soluble.

For example, the ligand can include a polymer including a random copolymer. The random copolymer can be made using any method of polymerization, including cationic, anion, radical, metathesis or condensation polymerization, for example, living cationic polymerization, living anionic polymerization, ring opening metathesis polymerization, group transfer polymerization, free radical living polymerization, living Ziegler-Natta polymerization, or reversible addition fragmentation chain transfer (RAFT) polymerization.

EXAMPLES

Synthesis of II-V semiconductor nanocrystals is discussed in, e.g., Green, M.; O'Brien, P., J Mater Chem 1999, 9, (1), 243-247; Shen, G. Z.; et al., J Phys Chem C 2007, 111, (13), 5044-5049; Wang, R. B.; et al., J Phys Chem C 2009, 113, (42), 17979-17982; Xie, R. G.; et al., Chem Mater 2010, 22, (13), 3820-3822; Fojtik, A.; et al., Chem Phys Lett 1985, 120, (6), 552-554; and Miao, S. D.; et al., J Am Chem Soc 2010, 132, (16), 5613; each of which is incorporated by reference in its entirety. Preparation of Cd$_3$As$_2$ nanocrystals used an aqueous method involving arsine gas that produced a solution with absorption and emission features in the visible and fluorescence quantum yields (QY) about 10% (Fojtik, A.; et al., Chem Phys Lett 1985, 120, (6), 552-554).

Cd$_3$P$_2$ nanocrystals can be synthesized from cadmium (II) oleate and tris(trimethylsilyl)phosphine (TMS$_3$P) (Miao, S. D.; et al., J Am Chem Soc 2010, 132, (16), 5613). These procedures used a single rapid injection of the phosphorous precursor into a hot solution containing cadmium (II) oleate to form Cd$_3$P$_2$ nanocrystals. Injection temperature, growth time, and surfactant concentration were modulated to control nanocrystal size.

A two-step procedure that used an initial fast injection of tris(trimethylsilyl)arsine (TMS$_3$As) into a solution containing cadmium (II) myristate at 175° C. formed small nuclei followed by slow, continuous addition of additional TMS$_3$As to promote growth was used to prepare Cd$_3$As$_2$ nanocrystals. It can be challenging to produce larger sizes of Cd$_3$As$_2$ nanocrystals using a single, higher-temperature injection. Using a two-step method with slow, continuous addition of additional precursors can facilitate preparation of larger sizes of these nanocrystals. This method also provides highly reproducible control over the final size and size distribution of the population. Populations have a desired peak emission wavelength can be reproducibly synthesized with a variation in the peak emission wavelength of ±10 nm.

Experimental

Materials:

Cadmium (II) myristate was prepared as described by Chen, O.; et al., Angew. Chemie Intl. Ed. 2008, 47, (45), 8638-8641, which is incorporated by reference in its entirety. Briefly, 60 mmoles of NaOH (99%, Mallinckrodt) and 60 mmoles myristic acid (99%, Sigma Aldrich) were dissolved in 1 L of methanol. 20 mmoles of Cd(NO$_3$)$_2$·4H$_2$O (99.9%, Alfa Aesar) were dissolved in 100 mL of methanol (99%, Sigma Aldrich), and added dropwise to the sodium myristate solution. The resulting precipitate was washed three times with methanol and recrystallized once from 1-butanol (99%, JT Baker).

Cd$_3$As$_2$ Nanocrystals:

In a typical core synthesis, 1 mmole of cadmium (II) myristate was dissolved in 5 mL of 1-octadecene (90%, Sigma Aldrich) (ODE), to form a clear solution at 100° C. This solution was degassed under vacuum until the pressure stabilized, typically below 100 mtorr. The injection solution was prepared in an inert glovebox by dissolving 0.05 mmole of tris(trimethylsilyl)arsine (99%, Nanomeps) (TMS$_3$As) in 0.8 mL of tri-n-octylphosphine (99%, Strem) (TOP) under minimal lighting. The injection solution was swiftly injected into the cadmium (II) myristate solution at 175° C. under vigorous stirring. After maintaining the solution at 175° C. for 20 minutes, a solution containing 0.5 mmoles of TMS$_3$As in 10 mL of TOP was injected via syringe pump at a rate of 1.5 mL/hr.

Cd$_3$As$_2$(Cd$_3$P$_2$) Core Shell Nanocrystals:

Core-shell nanocrystals were prepared by injection of 0.05 mmoles TMS$_3$As into 5 mL of ODE containing 0.5 mmoles of cadmium myristate at 130° C. The solution was heated to 175° C. before beginning addition of a solution containing 0.15 mmoles of tris(trimethylsilyl)phosphine dissolved in 3 mL of TOP at a rate of 1.5 mL/hr.

Cd$_3$As$_2$(CdS) Core Shell Nanocrystals:

Core-shell nanocrystals were prepared by injection of 0.05 mmoles TMS$_3$As (15 mg TMS$_3$As in 0.8 mL TOP) into 5 mL of ODE containing 0.3 mmoles (175 mg) of cadmium myristate at 150° C. After 15 min of growth at 150° C., 0.15 mmoles of TMS$_2$S (27 mg in 3 mL TOP) were injected at 1.5 mL/hr while the temperature was maintained at 150° C. The reaction was cooled after the shell material was added.

Preparation of Water Soluble Nanocrystals Via Ligand Exchange:

Polyimidazole ligands (PIL) were synthesized and used for ligand exchange to displace the native ligands of nanocrystals as described in Liu, W.; et al., J Am Chem Soc 2009, 132, (2), 472-483, which is incorporated by reference in its entirety. To summarize, nanocrystals (1 nmole) were precipitated using hexanes (30 μL), CHCl$_3$ (30 μL) and EtOH (200 μL) and brought into 50/IL of CHCl$_3$. The nanocrystal stock solution was mixed with solution a of PIL (4 mg) in CHCl$_3$ (30 μL), and stirred for 30 min at RT, after which 30 μL of MeOH was added followed by stirring for an additional 20 min. Nanocrystal samples were precipitated by the addition of EtOH (30 μL), CHCl$_3$ (30 μL), and excess hexanes. The sample was centrifuged at 4000 g for 2 min. The clear supernatant was discarded, and the pellet dried in vacuo, followed by the addition of PBS (500 μL, pH 7.4). The aqueous sample was then filtered through a 0.2 μm syringe filter before measuring the emission spectrum.

Absorption Spectroscopy:

Absorption spectra were collected on an HP 8453 spectrometer for samples with first absorption peaks of 800 nm and below. For samples with an absorption peak wavelength longer than 800 nm, a Cary 5000 UV-VIS-NIR spectrometer was used in double beam mode.

Photoluminescence Spectroscopy:

Emission spectra with peak emission wavelength less than 900 nm were collected with an Ocean Optics fiber optic spectrometer with excitation by a 594 nm HeNe laser. For samples with emission peaks between 900 nm and 1300 nm, a SpectraPro 300i spectrometer was used in conjunction with a liquid nitrogen cooled InGaAs camera with 512 pixels. For emission peaks longer than 1300 nm, a SpectraPro 300i spectrometer was used in conjunction with a liquid nitrogen cooled indium arsenide photodiode from Hamamatsu.

Transmission Electron Microscopy (TEM):

TEM samples were prepared by drop casting a purified solution of nanocrystals from hexane onto a 400 mesh copper grid with a carbon film (Ted Pella). TEM images were collected on JEOL 200CX and JEOL 2010 microscopes. Sizes were determined by taking the average diameter of ~100 nanocrystals measured using Adobe Photoshop.

Wide Angle X-Ray Scattering (WAXS):

The WAXS measurement was carried out on Rigaku High-Power Rotating Anode X-Ray Powder Diffractometer with a 185 mm radius goniometer using an accelerating voltage of 50 kV and a current of 250 mA. Copper Kα radiation was used (1.5406 Å). A home-built helium flow cell was used to minimize exposure to air.

Energy Dispersive Spectroscopy (EDS):

EDS measurements were performed using a JEOL 2010 TEM operated at 200 kV. Measurements were taken from 8-10 spots, each near the center of a window to avoid saturating the detector with signal from the copper grid. Data analysis was performed using the INCA software, and the relative compositions of the expected elements were calculated.

Nuclear Magnetic Resonance (NMR):

In a glovebox with an inert atmosphere, $TMS_3As$ was diluted in toluene (d8) (99%, Cambridge Isotopes, dried over 3 Å molecular sieves), with a diphenylmethane internal standard (3.771 ppm). An analogous cadmium (II) myristate solution was prepared with toluene (d8)/diphenylmethane, which was then heated to 100° C. to ensure complete dissolution. The $TMS_3As$ solution was added to an excess of the hot cadmium (II) myristate solution, and the solution immediately turned deep brown. $^1H$ NMR spectra were recorded after 1 minute and 5 minutes. $^1H$ NMR spectra were also recorded of the $TMS_3As$ solution at 20° C. and the cadmium (II) myristate solution at 80° C. All $^1H$ NMR spectra were taken on a Varian INOVA 500 MHz Nuclear Magnetic Resonance spectrometer fitted with a broadband tunable probe as described in Allen, P. M.; et al., Angew. Chem. Int. Ed. 49, (4), 760-762, which is incorporated by reference in its entirety.

Quantum Efficiency Measurements:

Quantum efficiencies were measured using a Teflon integrating sphere from Si-Photonics. A 785 nm diode laser was used as the excitation source. A NIST traceable calibrated germanium photodiode from Newport (818-IR) was used as the detector. An 800 nm colored glass longpass filter was used to block the excitation beam. Quartz NMR tubes were used to insert the sample into the integrating sphere, and a solvent blank was used to ensure as uniform of an environment inside the integrating sphere as possible. Photocurrent was adjusted by the external quantum efficiency of the detector in order to calculate the quantum yield.

Calculation of Volume Change after Adding Additional $TMS_3as$ by Syringe Pump:

The sample removed from the growth solution immediately before beginning the slow additional injection of $TMS_3As$ had an emission peak at 1.47 eV. After adding 10 equivalents of $TMS_3As$, the emission peak was located at 0.65 eV. According to the best fit formula this is an increase in volume by a factor of 10.3. The ratio of volumes calculated by the measured diameters of the initial and final solutions was 9.0.

Results and Discussion

Figures 1A, 1B:
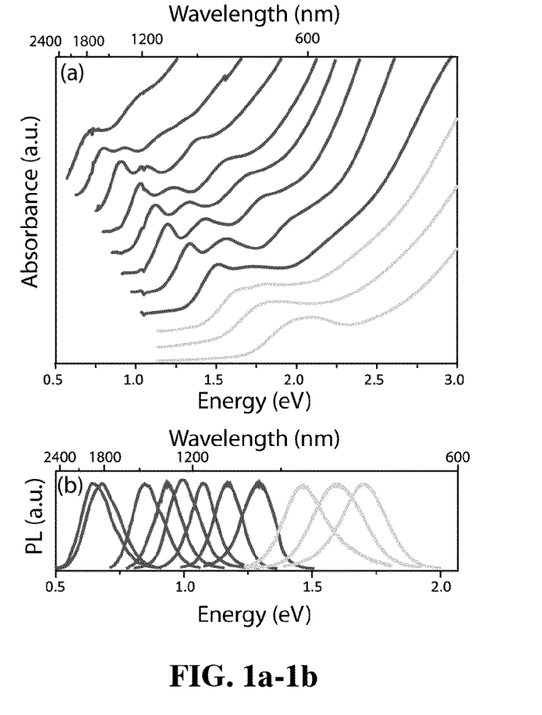
FIGS. 1a-1b show absorption (FIG. 1a) and corresponding emission (FIG. 1b) spectra from 11 aliquots removed during a single growth.
Figure 1C:
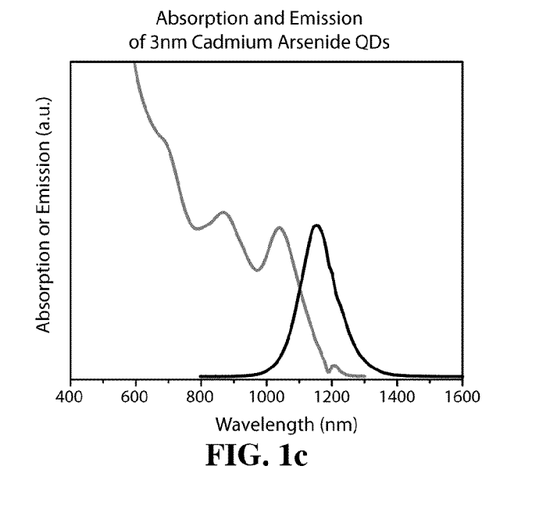
FIG. 1c shows absorption and emission spectra from a single cadmium arsenide nanocrystal sample ~3 nm in diameter.
Figure 2:
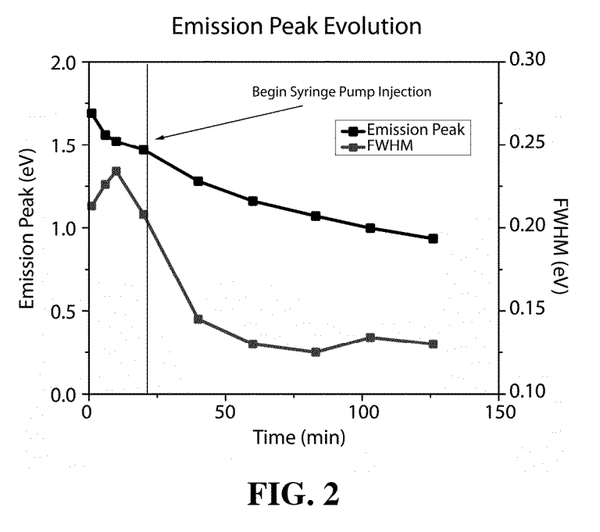
FIG. 2 shows evolution of emission peak location and full-width at half-maximum (FWHM) during nanocrystal growth, showing decrease in FWHM and accelerated growth rate after beginning the syringe pump injection.

Combined fast and slow injections allowed maintenance of narrow emission peaks while precisely tuning nanocrystal size. Absorption (FIG. 1a) and corresponding emission (FIG. 1b) spectra were recorded for 11 aliquots removed during a single growth. Sizes ranged from ~2 nm for the aliquot emitting at 1.65 eV, to ~5 nm for the aliquot emitting at 0.65 eV. The three highest-energy curves correspond to aliquots taken before the beginning of the continuous injection. The remaining curves correspond to aliquots taken during the continuous injection. FIG. 1c shows absorption and emission spectra from a single sample ~3 nm in diameter. After beginning the continuous injection, the gradual appearance of higher order absorption features characteristic of samples with narrow size distributions was observed (Murray, C. B.; Norris, D. J.; Bawendi, M. G., J Am Chem Soc 1993, 115, (19), 8706-8715, which is incorporated by reference in its entirety) and significant narrowing of the emission peak (FIG. 2). Furthermore, the slow addition of material allowed emission peak wavelengths to be tuned.

Figures 3A, 3C:
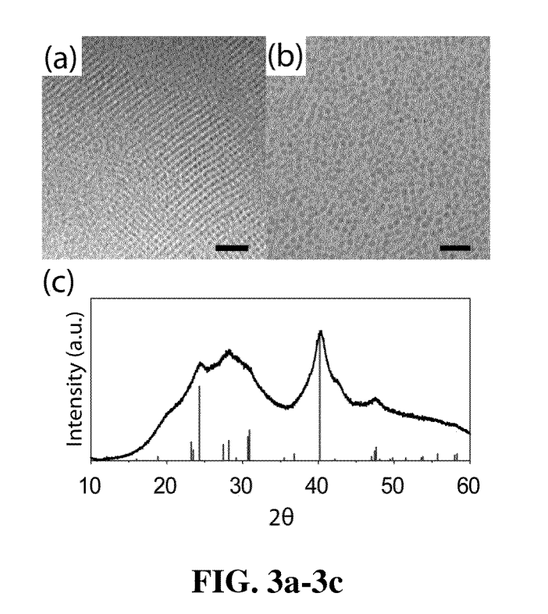
FIG. 3a shows a TEM image of 2.2 nm $Cd_3As_2$ nanocrystals with emission peak at 1.33 eV.
FIG. 3c shows WAXS of $Cd_3As_2$ nanocrystals with an emission peak at 1000 nm. The pattern was collected with Cu Kα radiation using a helium flow cell. The vertical lines represent expected peak values for α-$Cd_3As_2$.
Figure 3D:
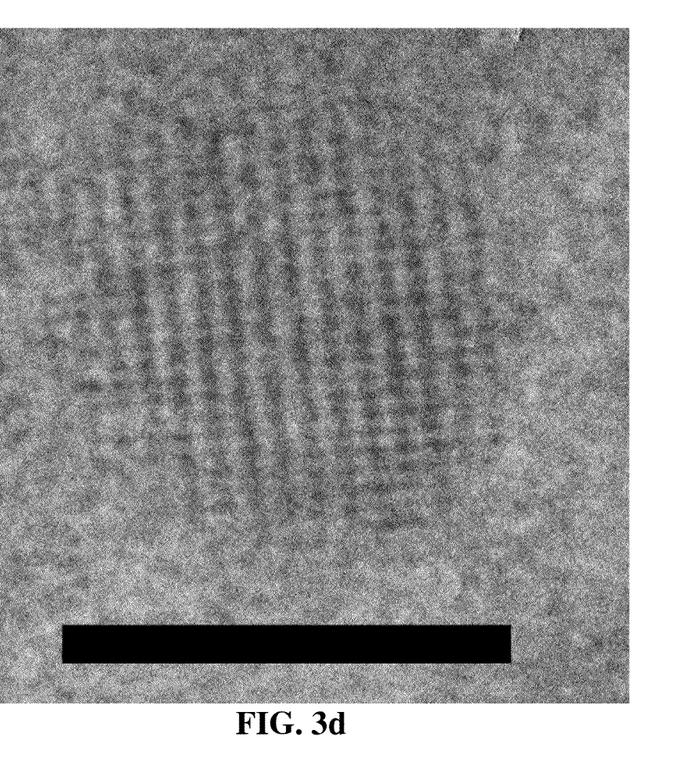
FIG. 3d is a high resolution TEM image of $Cd_3As_2$ nanocrystals emitting at 1900 nm. Scale bar is 5 nm.
Figure 4:
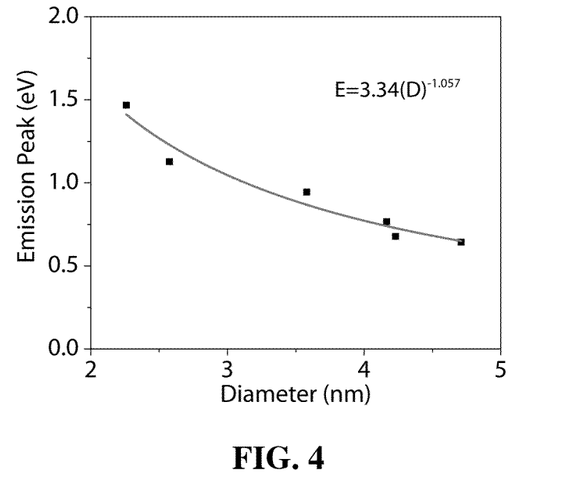
FIG. 4 is a graph showing emission peak vs. average diameter as measured by TEM. The variables in the best fit formula are E, emission peak in eV; D, diameter in nm.
Figures 5A, 5C:
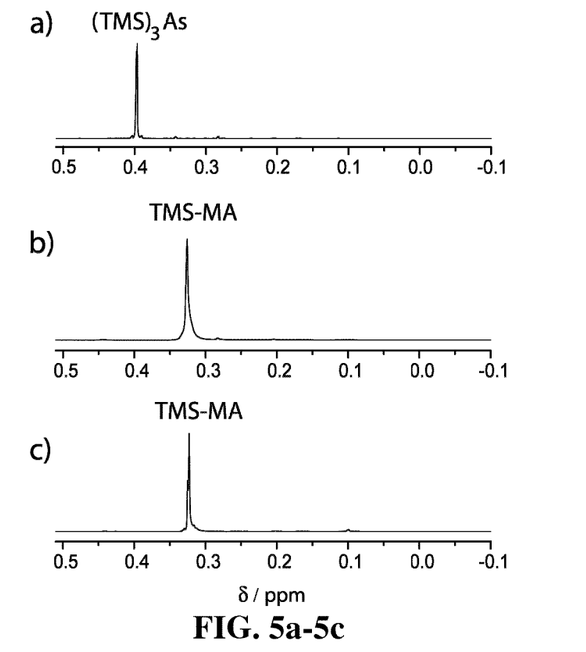

Transmission electron microscope (TEM) images showed narrow size distributions (FIGS. 3a-3b, 3d). Measurements show that during the slow injection the particles grow commensurate with the amount of arsenic precursor added (FIG. 4). Between the beginning and the end of the continuous addition of arsenic precursor, the particle volume increased by a factor of ~10. The amount of $TMS_3As$ added during the continuous injection step was 10 times the amount added during the initial injection. Therefore, particle growth was primarily due to the addition of new material to existing nuclei and not an Ostwald ripening mechanism that would result in a loss of nuclei and a log-normal size distribution (Sugimoto, T., J Colloid Interface Sci 1978, 63, (1), 16-26, which is incorporated by reference in its entirety). $^1H$ NMR confirmed that $TMS_3As$ was completely depleted after exposure to cadmium (II) myristate (FIGS. 5a-5c), eliminating the possibility that the increase in nanocrystal size was due to incomplete reaction and particle ripening.

Figure 6:
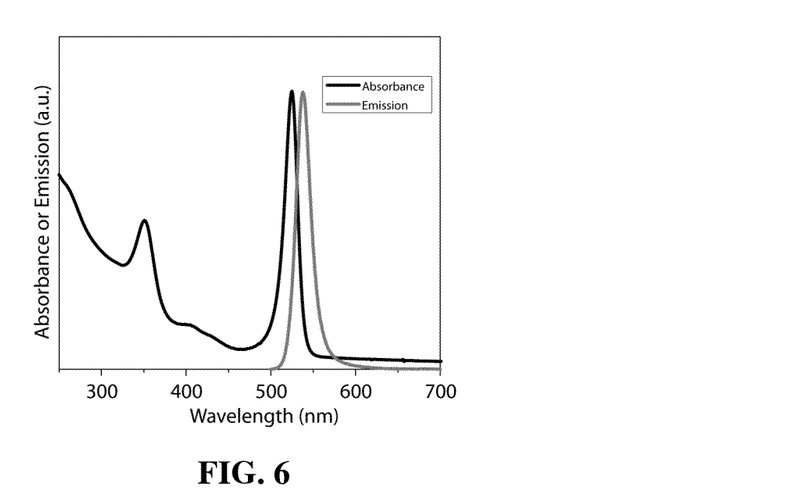
FIG. 6 shows absorption and emission spectra taken from a solution of $Cd_3As_2$ clusters one minute after injection at 130° C.

Initial injections at lower temperatures (130° C.) resulted in smaller particles showing well-defined absorption features and narrow emission at wavelengths as blue as 530 nm (FIG. 6). These features closely resemble those attributed to $Cd_3P_2$ magic sized clusters (Wang, R. B.; et al., J Phys Chem C 2009, 113, (42), 17979-17982, which is incorporated by reference in its entirety). With continued heating, the features became less well-defined and shifted to the red, ultimately resembling the spectra of nanocrystals synthesized at 175° C.

In addition to modulating temperature, different surfactant systems were examined. Xie et al. reported that by performing the injection at 230-250° C. and varying the concentration of oleic acid, they were able to control particle size while maintaining narrow emission peaks (Xie, R. G.; et al., Chem Mater 2010, 22, (13), 3820-3822, which is incorporated by reference in its entirety). Similar behavior was observed for $Cd_3As_2$ as well; however, high quality particles of <4 nm but no larger could be prepared using this method.

$TMS_3As$ dissolved in tri-n-octylphosphine (TOP) was injected into a solution containing 1-octadecene (ODE) and a twenty-fold excess of cadmium (II) myristate at 175° C. The solution was maintained at 175° C. for 20 minutes to produce cadmium arsenide nanocrystals emitting at 850 nm. After 20 minutes, a solution of $TMS_3As$ in TOP was added via syringe pump over several hours. Aliquots were taken periodically to monitor absorption and emission properties. When the emission of the nanocrystals reached the desired wavelength, the addition of $TMS_3As$ was halted and the solution cooled to room temperature. Absorption and emission spectra were taken without purification. When necessary, appropriate blanks were used to collect absorption spectra.

Following growth, the solution was transferred to a glovebox with a nitrogen atmosphere to prepare samples for structural characterization. The growth solution was purified by adding a small amount of acetone to induce flocculation and then centrifuging. The supernatant was discarded and the resulting precipitate was redispersed in hexane or chloroform. This process was repeated three times before drop-casting onto a TEM grid or silicon zero-background holder for wide angle X-ray scattering (WAXS).

The WAXS pattern was consistent with that expected for α-$Cd_3As_2$, the stable room temperature phase of $Cd_3As_2$ (FIG. 3c). However, due to the broadening associated with small crystallite size, the α' and β phases cannot be excluded. Application of the Scherrer formula implied an average crystallite size of ~2.5 nm. This was consistent with the size observed by TEM. It should be noted that due to the large unit cell of α-$Cd_3As_2$ (a=12.65 Å, c=25.44 Å) (see Steigmann, G. A.; Goodyear, J., Acta Crystallographica Section B 1968, 24, (8), 1062-1067, which is incorporated by reference in its entirety), a 2 nm diameter nanocrystal has a volume equivalent to roughly one unit cell.

Elemental analysis was performed using energy dispersive x-ray spectroscopy (EDS). The average ratio of cadmium to arsenic was measured to be 3:2 to within experimental error (Table 1).

TABLE 1

| Measurement No. | At. % Cadmium | At. % Arsenic |
|---|---|---|
| 1 | 60.27 | 39.73 |
| 2 | 57.33 | 42.67 |
| 3 | 58.08 | 41.92 |
| 4 | 60.69 | 39.31 |
| 5 | 59.38 | 40.62 |
| 6 | 59.30 | 40.70 |
| 7 | 61.39 | 38.61 |
| 8 | 58.95 | 41.05 |
| Average (%) | 59.42 | 40.57 |
| Standard Deviation (%) | 1.34 | 1.34 |

Figure 7:
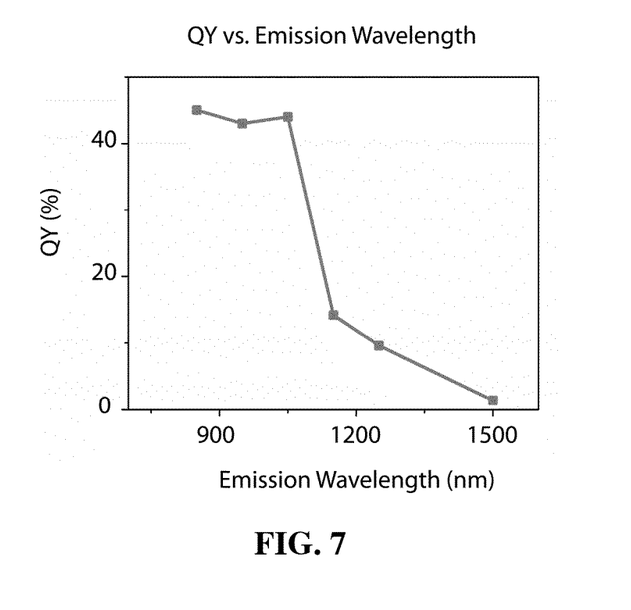
FIG. 7 is a graph showing QY of nanocrystal samples having varying emission wavelengths.
Figures 8A, 8C:
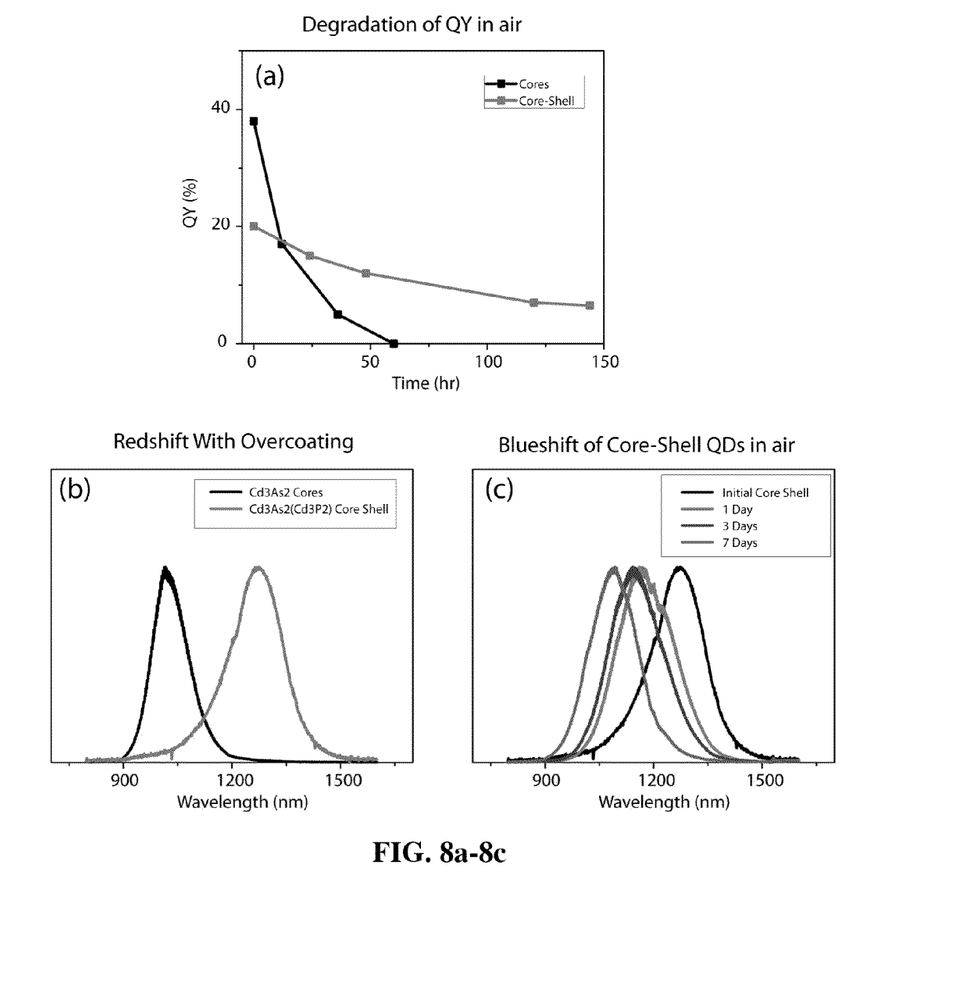

QYs measured immediately after removal from the growth solution using an integrating sphere ranged as high as 85% for some samples with emission peaks of ~900 nm. More typical values ranged from 20% to 60%. The measured QYs decreased substantially for larger particles (FIG. 7). This decrease could have resulted from increased rates of multiphonon relaxation for nanocrystals with narrower band edges in accordance with the energy gap law (Semonin, O. E.; et al., J. Phys. Chem. Lett. 2010, 1, (16), 2445-2450, which is incorporated by reference in its entirety). Like most other IR-emitting materials, $Cd_3As_2$ nanocrystals were found to be air sensitive with QYs declining to <1% after a few days in ambient conditions (FIG. 8a).

Figure 9:
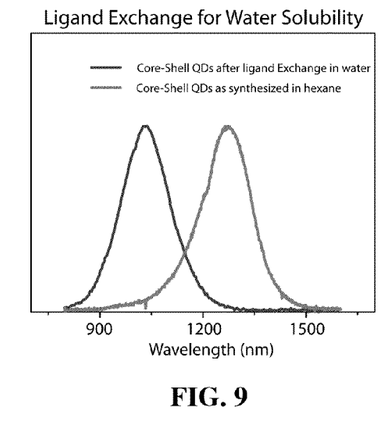
FIG. 9 shows emission spectra before and after ligand exchange for water solubility.

A high bandgap shell is advantageous for maintaining stability and maximizing quantum yield for II-VI and III-V semiconductor nanocrystals (see, e.g., Reiss, P.; Protiere, M.; Li, L., Small 2009, 5, (2), 154-168, which is incorporated by reference in its entirety). Cadmium phosphide ($Cd_3P_2$) was identified as a potential shell material due to its similar crystal structure and larger bandgap ($E_g$~0.5 eV) (Arushanov, E. K., Prog Cryst Growth Charact Mater 1992, 25, (3), 131-201; and Zdanowicz, W.; Zdanowicz, L., Annu. Rev. Mater. Sci. 1975, 5, 301-328; each of which is incorporated by reference in its entirety). An amount of $TMS_3P$ equivalent to 1-2 monolayers was dissolved in TOP and added dropwise to a solution of ~2.5 nm diameter $Cd_3As_2$ nanocrystals at 175° C. Addition of $TMS_3P$ resulted in continuous redshifting of ensemble emission (FIG. 8b), which suggested weaker confinement of the exciton as nanocrystal size increased as $TMS_3P$ reacts to form $Cd_3P_2$ on the nanocrystal surface. Elemental analysis of $Cd_3As_2(Cd_3P_2)$ nanocrystals by EDS confirmed that the nanocrystals had an atomic composition of 62.7% cadmium, 10.5% arsenic, and 26% phosphorous (Table 2). The ratio of phosphorous to arsenic measured by EDS was consistent with the ratio added to the reaction (3:1 P:As). The shell growth was found to significantly extend the shelf-life of $Cd_3As_2$ nanocrystals stored in ambient conditions (FIG. 8a). The shell provided sufficient stability such that emission was observed after surfactant exchange and dissolution in water, although the QY was <1% after exchange (FIG. 9). During exposure to air or water, the emission peak of the core-shell structure shifted to higher energy. The blue-shifted spectrum of a core-shell solution resembled the emission spectrum of the $Cd_3As_2$ cores (FIG. 8c), suggesting that the shell was dissolving or deteriorating. The decrease in QY was consistent with shell deterioration.

TABLE 2

| Measurement No. | At. % Cadmium | At. % Arsenic | At. % Phosphorous |
|---|---|---|---|
| 1 | 59.6 | 10.1 | 30.3 |
| 2 | 61.36 | 10.78 | 27.86 |
| 3 | 65.76 | 9.7 | 24.54 |
| 4 | 63.04 | 9.11 | 27.85 |
| 5 | 63.99 | 8.93 | 27.07 |
| 6 | 65.18 | 8.23 | 26.58 |
| 7 | 59.3 | 13.38 | 27.33 |
| 8 | 57.89 | 12.48 | 29.63 |
| 9 | 63.69 | 9.27 | 27.03 |
| 10 | 66.92 | 12.81 | 20.27 |
| Average (%) | 62.673 | 10.479 | 26.846 |
| Standard Deviation (%) | 3.0 | 1.8 | 2.8 |

Figure 10:
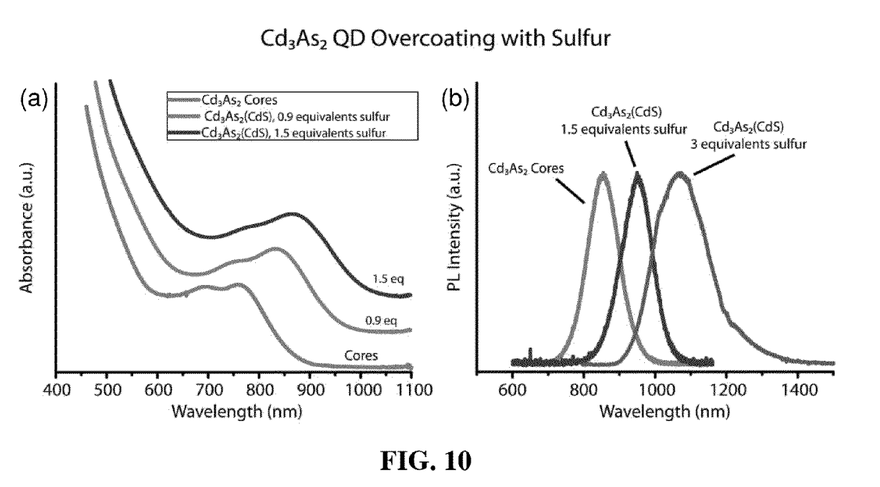
FIGS. 10a-10b show absorption (FIG. 10a) and emission (FIG. 10b) spectra of $Cd_3As_2$ nanocrystals with varying thicknesses of CdS overcoating.
Figure 11:
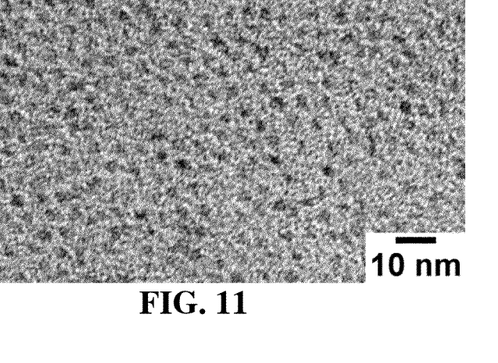
FIG. 11 is a TEM image of $Cd_3As_2(CdS)$ nanocrystals.

Absorption and emission spectra of $Cd_3As_2(CdS)$ nanocrystals are shown in FIGS. 10a-10b. A TEM image of $Cd_3As_2$ (CdS) nanocrystals is shown in FIG. 11.

Other embodiments are within the scope of the following claims.

What is claimed is:

1. A population of semiconductor nanocrystals comprising a plurality of cores including $Cd_3As_2$, wherein the population is a monodisperse population, wherein the population has emission wavelength falling within the range of about 530 nm to about 2000 nm.

2. The population of claim 1, wherein the cores have 10% or less rms deviation in diameter.

3. The population of claim 1, wherein the population has a photoluminescence quantum yield of at least 20%.

4. The population of claim 1, wherein the plurality of cores has an average diameter filling within the range of about 2 nm to about 5 nm.

5. The population of claim 1, wherein the semiconductor nanocrystals further comprise an overcoming including a semiconductor material on the cores.

6. The population of claim 5, wherein the overcoating includes a II-V semiconductor material, a II-VI semiconductor material, a III-V semiconductor material, or a combination thereof.

7. The population of claim 6, wherein the overcoating includes a II-V semiconductor material having a bulk band gap larger than the bulk band gap of $Cd_3As_2$.

8. The population of claim 7, wherein the II-V semiconductor material of the overcoating includes $Cd_3P_2$.

9. A size-series of populations of semiconductor nanocrystals, comprising a plurality of populations of semiconductor nanocrystals including cores including $Cd_3As_2$, wherein the cores of each population have a different average diameter than the cores of the other populations, wherein the populations have emission wavelengths falling within the range of about 530 nm to about 2000 nm.

10. The series of claim 9, wherein each population is a monodisperse population.

11. The series of claim 9, wherein at least one population has a visible emission wavelength.

12. The series of claim 9, wherein at least one population has an infrared emission wavelength.

13. The series of claim 9, wherein the series includes at least five populations having emission wavelengths spanning the range of about 600 nm to about 1800 nm.

14. The series of claim 9, wherein the cores of each population have an average diameter falling within the range of about 2 nm to about 5 nm.

15. A method of making semiconductor nanocrystals, comprising:
introducing into a coordinating solvent an cadmium-containing compound and an arsenic donor, thereby forming a population of semiconductor nanocrystals including a plurality of cores including $Cd_3As_2$, wherein the population is a monodisperse population.

16. The method of claim 15, wherein introducing comprises heating a composition including the coordinating solvent and the cadmium-containing compound, rapidly adding a first portion of the arsenic donor to the composition, and slowly adding a second portion of the arsenic donor.

17. The method of claim 16, wherein slowly adding the second portion includes a substantially continuous slow addition of the second portion.

18. The method of claim 17, further comprising stopping a reaction when the population of semiconductor nanocrystals has a desired size, desired peak absorption wavelength, or desired peak emission wavelength.

19. The method of claim 18, wherein the method reproducibly forms populations of semiconductor nanocrystals having the same desired peak emission wavelength 10 nm.

20. The method of claim 15, wherein the plurality of cores has an average diameter falling within the range of about 2 nm to about 5 nm.

21. The method of claim 20, further comprising forming an overcoating including a semiconductor material on the cores.

22. A size-series of populations of semiconductor nanocrystals, comprising a plurality of populations of semiconductor nanocrystals including cores including $Cd_3As_2$, wherein the cores of each population have a different average diameter than the cores of the other populations, wherein at least one population has an infrared emission wavelength.

23. A size-series of populations of semiconductor nanocrystals, comprising a plurality of populations of semiconductor nanocrystals including cores including $Cd_3As_2$, wherein the cores of each population have a different average diameter than the cores of the other populations, wherein the series includes at least five populations having emission wavelengths spanning the range of about 600 nm to about 1800 nm.

* * * * *